(12) United States Patent
Cohn et al.

(10) Patent No.: US 6,872,902 B2
(45) Date of Patent: Mar. 29, 2005

(54) MEMS DEVICE WITH INTEGRAL PACKAGING

(75) Inventors: Michael B. Cohn, Berkeley, CA (US); Ji-Hai Xu, El Sobrante, CA (US)

(73) Assignee: MicroAssembly Technologies, Inc., Richmond, CA (US)

(*) Notice: Subject to any disclaimer, the term of this patent is extended or adjusted under 35 U.S.C. 154(b) by 0 days.

(21) Appl. No.: 10/608,294

(22) Filed: Jun. 27, 2003

(65) Prior Publication Data

US 2004/0066258 A1 Apr. 8, 2004

Related U.S. Application Data

(63) Continuation of application No. 09/997,671, filed on Nov. 28, 2001, now abandoned.
(60) Provisional application No. 60/253,851, filed on Nov. 29, 2000.

(51) Int. Cl.$^7$ .............................................. H01H 57/00
(52) U.S. Cl. .......................... 200/181; 335/78; 335/80; 438/106; 438/456
(58) Field of Search ..................... 335/78–85, 151–154; 200/181, 600; 438/106–110, 118–125, 455, 456

(56) References Cited

U.S. PATENT DOCUMENTS

| | | |
|---|---|---|
| 5,258,591 A | 11/1993 | Buck |
| 5,367,136 A | 11/1994 | Buck |
| 5,430,421 A | 7/1995 | Bornand et al. |
| 5,472,539 A | 12/1995 | Saia et al. |
| 5,578,976 A | 11/1996 | Yao |
| 5,629,918 A | 5/1997 | Ho et al. |
| 5,744,752 A | 4/1998 | McHerron et al. |
| 5,778,513 A | 7/1998 | Miu et al. |
| 5,874,675 A | 2/1999 | Edmans et al. |
| 6,025,767 A | 2/2000 | Kellam et al. |
| 6,124,650 A | 9/2000 | Bishop et al. |
| 6,297,072 B1 | 10/2001 | Tilmans et al. |
| 6,469,602 B2 | 10/2002 | Ruan et al. |

FOREIGN PATENT DOCUMENTS

| | | |
|---|---|---|
| WO | WO98/09312 | 3/1998 |
| WO | WO99/17322 | 4/1999 |
| WO | WO99/21204 | 4/1999 |

OTHER PUBLICATIONS

M. Sakata et al., "Micromachined relay which utilizes single crystal silicon electrostatic actuator," Proc. IEEE Micro-ElectroMechanical Systems: MEMS–99, pp. 21–24, Orlando, Florida, USA, Jan. 1999.

Primary Examiner—Ramon M. Barrera
(74) Attorney, Agent, or Firm—Fenwick & West LLP

(57) ABSTRACT

A MEMS device and method of making same is disclosed. In one embodiment, a micro-switch includes a base assembly comprising a movable structure bearing a contact pad. The base assembly is wafer-scale bonded to a lid assembly comprising an activator and a signal path. The movable structure moves within a sealed cavity formed during the bonding process. The signal path includes an input line and an output line separated by a gap, which prevents signals from propagating through the micro-switch when the switch is deactivated. In operation, a signal is launched into the signal path. When the micro-switch is activated, a force is established by the actuator, which pulls a portion of the movable structure upwards towards the gap in the signal path, until the contact pad bridges the gap between the input line and output line, allowing the signal to propagate through the micro-switch. Prior to bonding, the MEMS structures are annealed on a first wafer and the conductive traces and other metals are annealed on a second wafer to allow each wafer to be processed separately using different processes, e.g., different annealing temperatures.

46 Claims, 13 Drawing Sheets

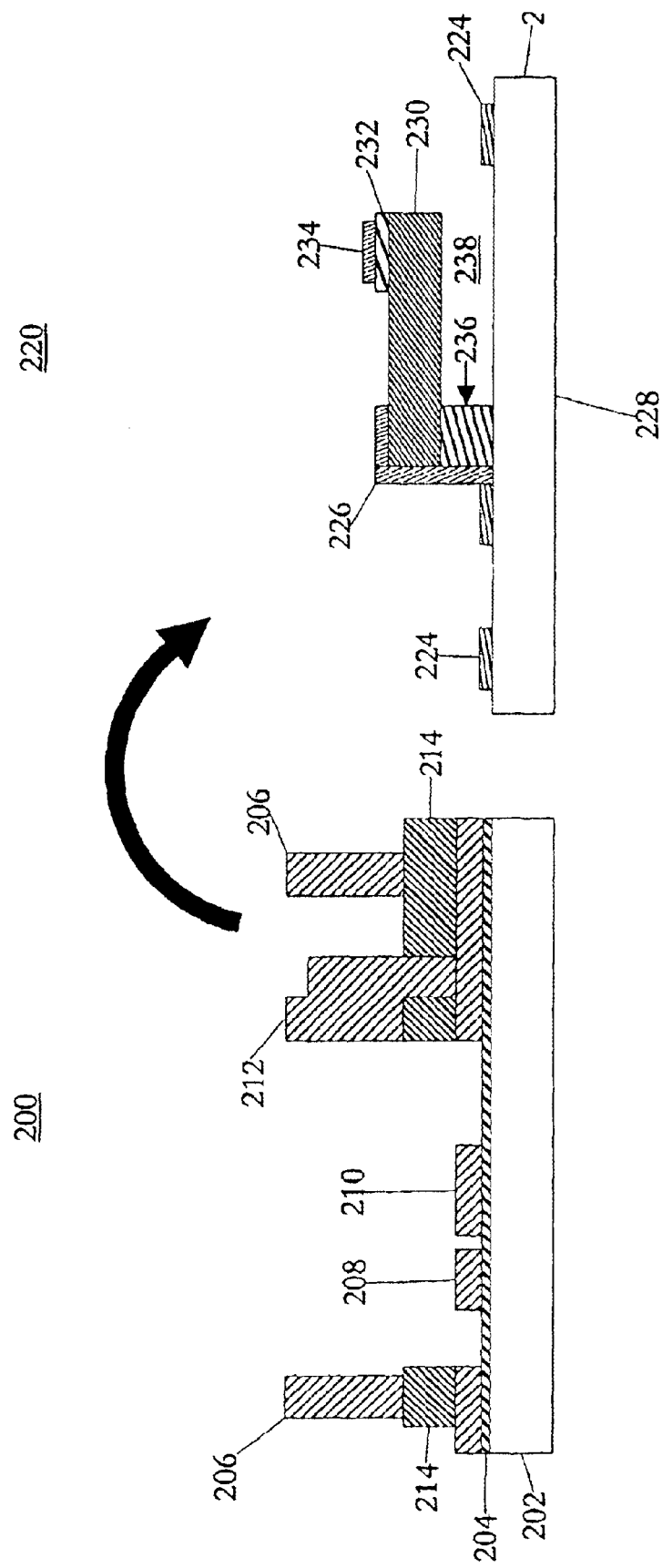

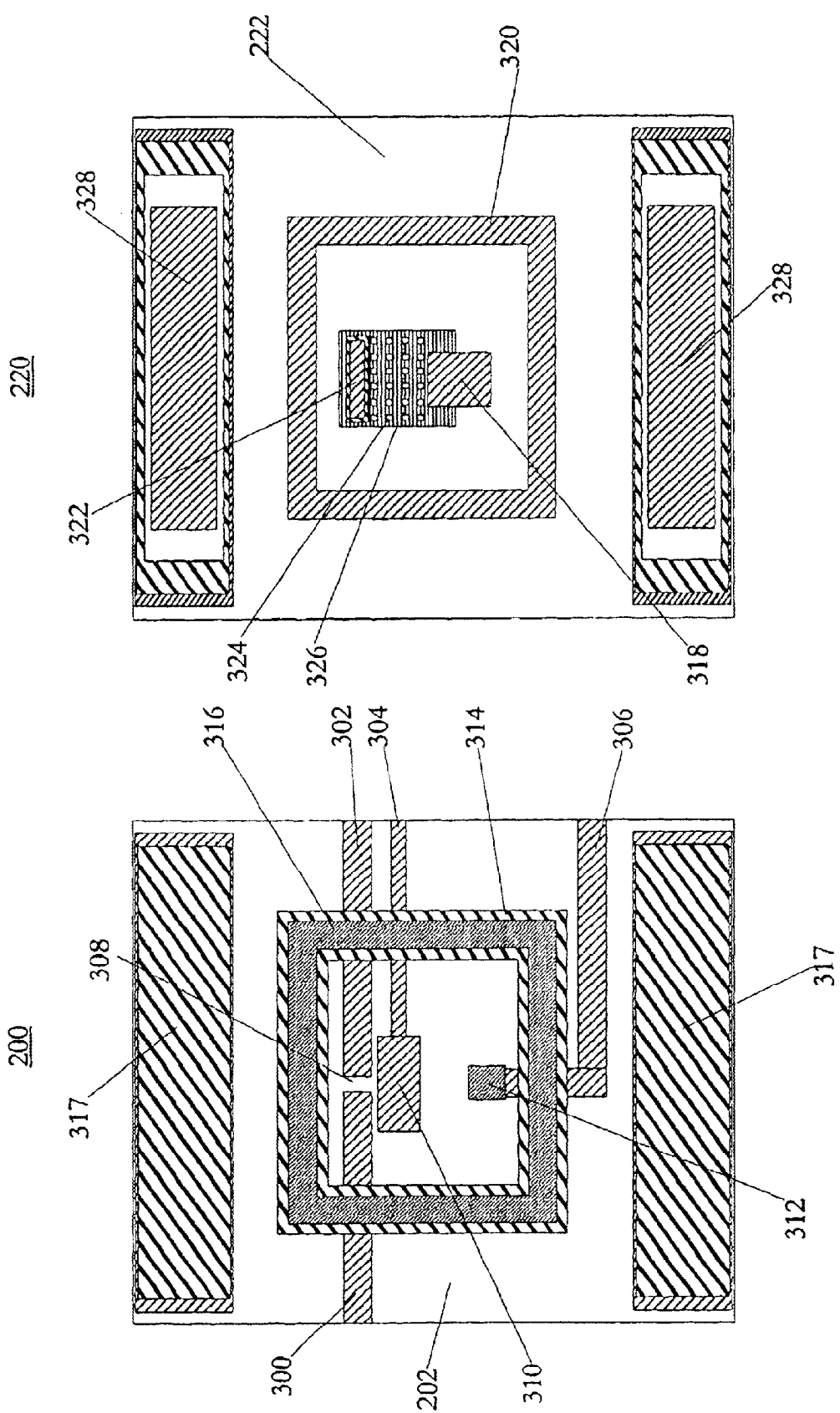

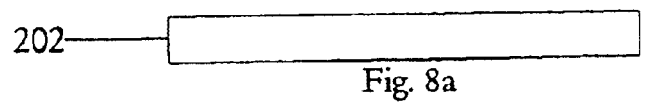
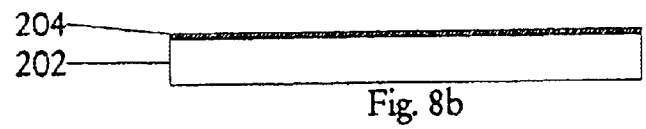
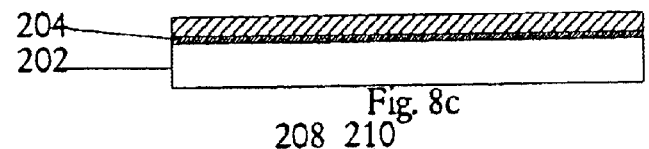
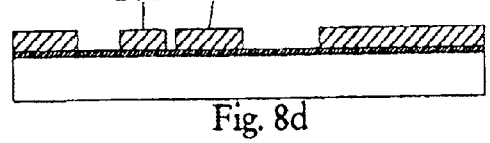
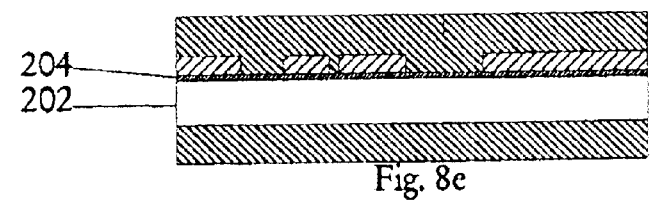
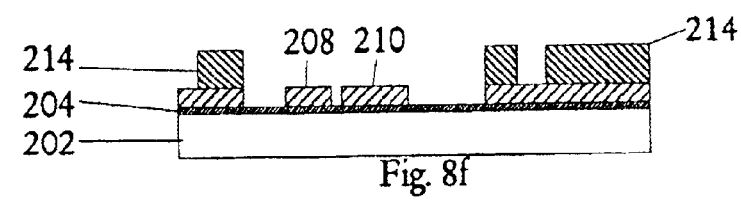
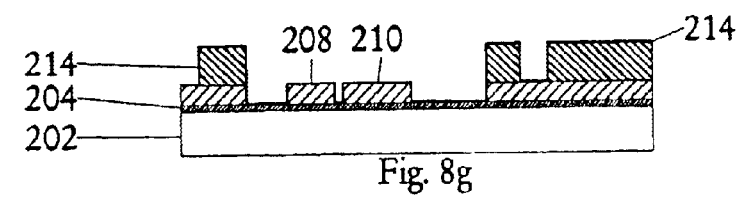
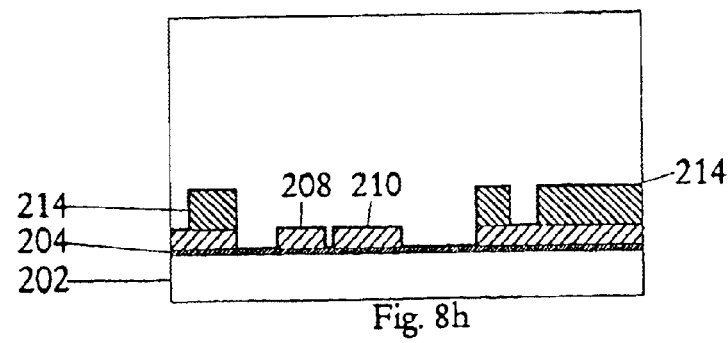

MEMS DEVICE WITH INTEGRAL PACKAGING

CROSS-REFERENCE TO RELATED APPLICATIONS

This application is a continuation of U.S. application Ser. No. 09/997,671, filed Nov. 28, 2001 now abandoned, which claims the benefit of U.S. Provisional Application No. 60/253,851, filed Nov. 29, 2000, which is incorporated by reference herein.

BACKGROUND

1. Field of the Invention

The present invention relates to the packaging of semiconductor devices and, more particularly, to the use of wafer-scale bonding techniques in the packaging of microelectromechanical systems (MEMS).

2. Background

MEMS devices have been manufactured in the past using integrated circuit (IC) fabrication techniques. Although MEMS devices are generally fabricated on silicon wafers, MEMS devices are different from most ICs in that they possess moving elements. These moving elements make MEMS devices vulnerable to contamination and moisture because they cannot be encapsulated in a typical injection-molded plastic package, i.e., at least one element of every MEMS device must remain free to move.

Several specialized methods, which are directed to different stages of the fabrication process, have been employed for the sealing and packaging of MEMS. One early method directed to the final packaging stage employs a ceramic package with a co-fired lead frame, a cavity to contain a complete MEMS device and a lid to cover the package and cavity. With this chip-scale packaging method, the MEMS device is placed inside the cavity and the lid is soldered in place to form a hermetic seal. One problem with this chip-scale packaging approach is the expense associated with handling the individual components (e.g., the packages, lids, etc.) and assembling them into a single package. An additional problem with this chip-scale packaging approach is that the moving elements in MEMS are extremely fragile and tend to be damaged by any handling, especially near the end of the fabrication process. Therefore, packaging yields are typically low. A further problem with this packaging approach is that the solder seal on the lid tends to outgas when re-flowed during the final sealing process. If a vacuum is needed inside the package, a getter must be added, at additional cost. In such cases, packaging costs can constitute 80% of the total device cost. In sum, the use of ceramic packages to seal and package MEMS devices is inordinately expensive due to the need to individually handle components, the need to use getters and the considerable opportunity for damage and contamination of the MEMS devices.

A wafer-scale pre-packaging technique of bonding two wafers together has been used to bond a wafer of silicon or glass onto a MEMS wafer. In this back-end process, a non-conductive glass frit is screen-printed onto a lid wafer in the shape of rings or gaskets. The wafers are then placed together to form cavities containing MEMS devices and bonded by the application of heat in excess of 400° C. After bonding, the two-wafer stack is diced and the resulting hybrid structures are packaged in the standard manner: by encapsulation in plastic packages such as DIPs, SOICs, etc.

Although this process has been marginally successful, it suffers from the deficiency that the glass frit cannot be patterned into fine features. Typically, gasket pattern line widths are between 100–200 microns. Given that MEMS are currently made with dimensions or features in the one-micron size range, significant real estate must be sacrificed, thereby significantly reducing the number of devices that can be fabricated on a single wafer. Attempts have been made to improve the glass frit patterning resolution, using lithographic methods, but these have not shown success. Further, gasket patterns thinner than 100–200 microns in width do not appear to provide reliable hermetic seals, possibly because of the inherently porous nature of glass frits. Thus, it is currently believed that glass frit techniques simply cannot be applied on a smaller scale where hermetic seals are desired.

Glass frit techniques also require high temperatures of between about 450–600 Celsius for sealing to occur. One drawback of using such a high firing temperatures is that it effectively precludes the incorporation of integrated circuitry on either of the wafers bonded together. These temperatures also preclude the use of most anti-stiction coatings and hydrophobic coatings, which are desirable for improving manufacturing yields and the MEMS's tolerance to moisture and shock. Such high temperatures also damage the MEMS themselves and, particularly, certain structural films deposited at lower temperatures and structures in which the film stress must be carefully controlled.

Another deficiency of glass frit techniques is that the glass frit itself employs organic binders that outgas into the sealed cavity during firing. Since getters are not available to combat this problem, this fact precludes the use of glass frits for vacuum applications. Still another limitation of the glass frit techniques is that the sealing materials, being non-conductive, cannot be used to establish electrical coupling between the devices disposed on the bonded substrates.

Front-end wafer-scale bonding techniques which can be used for sealing MEMS have also been developed, including anodic bonding, silicon fusion bonding, and other wafer-bonding methods employing combinations of silicon, silicon dioxide, and silicon nitride. These techniques can provide vacuum and hermetic seals and can do so with improved use of device real estate. These techniques, however, have low throughput and require high temperatures for high-quality bonds because their bonding mechanisms involve solid diffusion across the bond interface. Additionally, these techniques place strict constraints on the materials and processes used to form the wafers to be bonded together. Wafer-scale bonding techniques are exceptionally sensitive to the presence of small particulate contaminants, wafer warpage, scratches, and other imperfections commonly encountered during semiconductor fabrication because such contaminants can cause large defects in the bond and reduce yield substantially. Moreover, normal variations in surface topology due to the presence of circuitry can preclude proper bonding and/or sealing using such techniques. All of these factors make it difficult to employ wafer-bonding techniques with wafers that have undergone a significant amount of processing (e.g., wafers bearing finished microstructures).

One micro-switch. The micro-switch can be used in, for example, mobile phones for switching RF signals between transmit and receive modes and other related functions. Additional applications include micro-relays, which can be used in, for example, automated test equipment (ATE). As will be described below with respect to FIGS. 1a and 1b, fabricating a hermetically sealed micro-switch using materials having good mechanical qualities is difficult to achieve using prior art front-end, wafer-scale bonding techniques.

Referring to FIGS. 1a and 2b, there are shown cross-sectional views of a prior art MEMS device 100 configured to operate as a micro-switch (hereinafter also referred to as "micro-switch 100"). FIG. 1a is a cross-sectional view of the micro-switch 100 in its "deactivated" state (i.e., no electric field 118 present) and FIG. 1b is a cross-sectional view of the micro-switch 100 in its "activated" state (i.e., electric field 118 present).

The micro-switch 100 includes substrate 102, pedestal 104, actuator 106, cantilever 108, contact pad 110, and signal path 112. The substrate 102 is typically made of silicon and provides a support base for the pedestal 102 and the cantilever 108. The pedestal 102 and the cantilever 108 are formed in different layers upon the substrate 102 using known IC fabrication processes (e.g., CMOS). The pedestal 104 is disposed on the substrate 102. It provides support for the cantilever 108 and also provides a sidewall 114, which together with the cantilever 108 and the substrate 102 defines a gap 116. The gap 116 is typically very small (e.g., on the order of 2 microns in the vertical dimension). It provides the cantilever 108 with at least one degree of freedom.

The contact pad 110 is disposed on a free end (distal end) of the cantilever 108 and is typically made of metal. The location of the contact pad 110 on the cantilever 108 is selected to ensure that it makes electrical contact with the signal path 112, when the actuator 106 is activated and the cantilever 108 is pulled downward towards the substrate 102 in response to an electric or magnetic field 118, as shown in FIG. 1b.

The signal path 112 is disposed on the substrate 100 in aligned opposition with the contact pad 110. It is typically a metal trace or strip, which serves as a path for signals propagating through the micro-switch 100. The signal path 112 includes a gap (not shown) in a location corresponding to the location of the contact pad 110 on the cantilever 108. If the actuator 106 is inactive, a signal launched into the signal path 112 cannot propagate through the micro-switch 100 due to the gap.

The actuator 106 is disposed on the substrate 100. It establishes a field 118 (shown in FIG. 1b) when supplied with a drive voltage. The field 118 provides a force that pulls the cantilever 108 downward toward the substrate 102, until the contact pad 110 bridges the gap in the signal path 112. In this "activated" state, a signal launched into the signal path 112 will propagate through the micro-switch 100 due to the bridged gap 116 provided by the contact pad 110. FIG. 1b shows the cantilever 108 pulled into electrical contact with the signal path 112, thereby bridging the gap to allow signals to propagate through the micro-switch 100.

It would be desirable to fabricate the prior art cantilever 108 from materials that exhibit good mechanical qualities. One example of such material is polycrystalline silicon ("polysilicon'), which has been extensively studied and is known to be a desirable material for fabricating micromechanical devices. Polysilicon, however, is not generally used to fabricate prior art switches (e.g., micro-switch 100), because the cantilever 108 is designed to lie over the contact pad 110, and therefore must be deposited on the substrate 102 after the contact pad 110 in the fabrication process flow. The high temperature of the polysilicon anneal (e.g., above 400° C.) may cause the contact pad 110 to melt, delaminate, or interdiffuse with other material layers, thus making polysilicon an unsuitable material for the cantilever 108.

This problem was addressed in the past by using low temperature deposited materials, such as PECVD silicon nitride. The disadvantage with this prior art technique is that a high temperature anneal is typically needed to control warping of the cantilever 108 due to stress gradients. The degree of warping (curling of the cantilever 108 up or down with respect to the substrate 102) is not easily controlled and leads to wide variations in the voltage required to actuate the cantilever 108. This is typically not acceptable in a mass-produced device.

Accordingly, there is a need for a novel wafer-scale bonding technique that can employ materials having desirable mechanical qualities. Such a technique should enable massive, parallel assembly of hermetically sealed, low-cost MEMS devices, and thus should provide high yields. To realize these advantages, the technique should not require extreme wafer planarity or cleanliness. Additionally, there is a need for an improved micro-switch/relay device, fabricated using the novel wafer-scale bonding technique from materials having desirable mechanical qualities, to provide improved performance and reliability over prior art MEMS devices.

SUMMARY

The present invention eliminates the foregoing difficulties through the use of a novel wafer-scale bonding technique that enables massively parallel assembly of sealed, low-cost, reliable MEMS devices using materials having desirable mechanical qualities, which technique does not require extreme wafer planarity or cleanliness.

In one embodiment of the present invention, a micro-switch includes a base assembly having a movable structure bearing a contact pad, and a lid assembly having an actuator and a signal path. A plurality of lid assemblies are fabricated in parallel on a first wafer and a plurality of base assemblies are fabricated in parallel on a second wafer, thus allowing each wafer to be processed separately using different processes (e.g., different annealing temperatures). The first wafer is then bonded to the second wafer causing each lid/base assembly pair to form a sealed cavity. The sealed cavity is adapted to hold the movable structure, which structure can move in at least one degree of freedom within the sealed cavity.

In one embodiment of the present invention, the signal path in the lid assembly includes an input line and an output line separated by a gap, which prevents signals from propagating through the micro-switch. In operation, a force is established by the actuator, which pulls a portion of the movable structure upwards towards the gap in the signal path, until the contact pad bridges the gap between the input line and output line, allowing signals to propagate through the micro-switch.

In one embodiment of the present invention, the lid assembly includes an insulation ring disposed on the first substrate and a metal seal ring substantially aligned with and overlying the insulation ring, such that the metal seal ring forms a seal around the movable structure and the insulating ring electrically insulates the metal seal ring from the signal path. The signal path runs under the insulation ring to connect with an external contact point, such as a wire bond pad.

An additional advantage of the present invention is that the improved planarity of the movable structure leads to improved planarity of the contact pad. This, in turn, is believed to enable longer lifetime of the micro-switch.

A further advantage of the present invention is that the bonding enables hermetic sealing. Hermetic sealing has been shown to significantly improve device lifetime.

Another advantage of the present invention is the use of high-temperature materials in the movable structure, allowing the use of higher temperatures in the metal deposition steps that form the contacting surfaces. As a general principle, materials that are formed or processed at higher temperatures display greater reliability and wear resistance. These are critical factors in a micro-switch, because of the metal-to-metal contact, which may be repeated up to about $10^{12}$ times in the life of the device.

A further advantage of the present invention is that a wider choice of materials is available for the metal contacts. This is because they are the last materials deposited on their respective wafers.

An additional advantage is that the gap between the metal contacts can be controlled directly, by varying the thickness of the seal ring. This thickness can be controlled to within about 5–10%.

Yet another advantage of the present invention is improved yield. The present invention enables all of the microstructures on a given wafer to be protected immediately after release. Thus, they are protected during dicing. In the past, MEMS devices were generally diced before packaging. Particulates and water present during the dicing process would damage devices, drastically lowering yield.

A further advantage of the present invention is that very small electrical connections can be formed between the two substrates. This allows, for example, high-frequency or noise-sensitive signals to be coupled between them with a minimum of attenuation or degradation. A serious challenge in the design of MEMS, for example, is coupling signals from a mechanical microstructure to an integrated circuit, when the two are formed on separate substrates. Wire bond pads, or solder bumps, with a typical size of 100×100 um, comprise a significant parasitic capacitance. The interconnection approach of the present invention, for example, using metal micro-bumps in the 10×10 um range, enable a hundred-fold reduction of parasitic capacitance.

BRIEF DESCRIPTION OF THE DRAWINGS

These and other features, aspects, and advantages of the present invention will become better understood with regard to the following description, appended claims, and accompany drawings where:

FIG. 2a is a cross-sectional view of a lid assembly 200 of a micro-switch 400, fabricated in accordance with the present invention;

FIG. 2b is a cross-sectional view of a base assembly 220 of a micro-switch 400, fabricated in accordance with the present invention;

FIG. 3a is a top plan view of the lid assembly 200 shown in FIG. 2a, fabricated in accordance with the present invention;

FIG. 3b is a top plan view of the base assembly 220 shown in FIG. 2b, fabricated in accordance with the present invention;

FIG. 7 is a flow diagram showing the process flow steps used in the fabrication of the lid assembly 200 shown in FIG. 2a;

FIGS. 8a–l are cross-sectional views showing the process flow steps used in the fabrication of the lid assembly 200 shown in FIG. 2a;

FIGS. 11a–b illustrate a wafer-scale bonding technique used to fabricate the micro-switch 400 shown in FIG. 4a.

DETAILED DESCRIPTION OF EMBODIMENTS

Although the MEMS device described below is a micro-switch, it should be understood by the reader that the present invention is not limited to a micro-switch, but also applies to other types of MEMS devices, including but not limited to optical switches, micro-relays, microdisplays, optical attenuators, variable optical attenuators, variable capacitors, phase shifters, surface acoustic wave devices, film bulk acoustic resonator (FBAR) devices, inductors, gyroscopes, accelerometers, pressure sensors, fluidic channels, chambers, resonators, strain sensors, rotary accelerometers, fiber optic aligners, optical micro-benches, scratch drives, and actuators. As used herein, the terms "micro-switch" and "micro-relay" are interchangeable.

Although the description below refers to a single micro-switch, it should be understood that a plurality of such devices are typically fabricated (as opposed to a single device) simultaneously by bonding two wafers together in accordance with the present invention. Such techniques provide massive parallel assembly of sealed MEMS devices with high device yields.

Lid Assembly

Figure 4A:
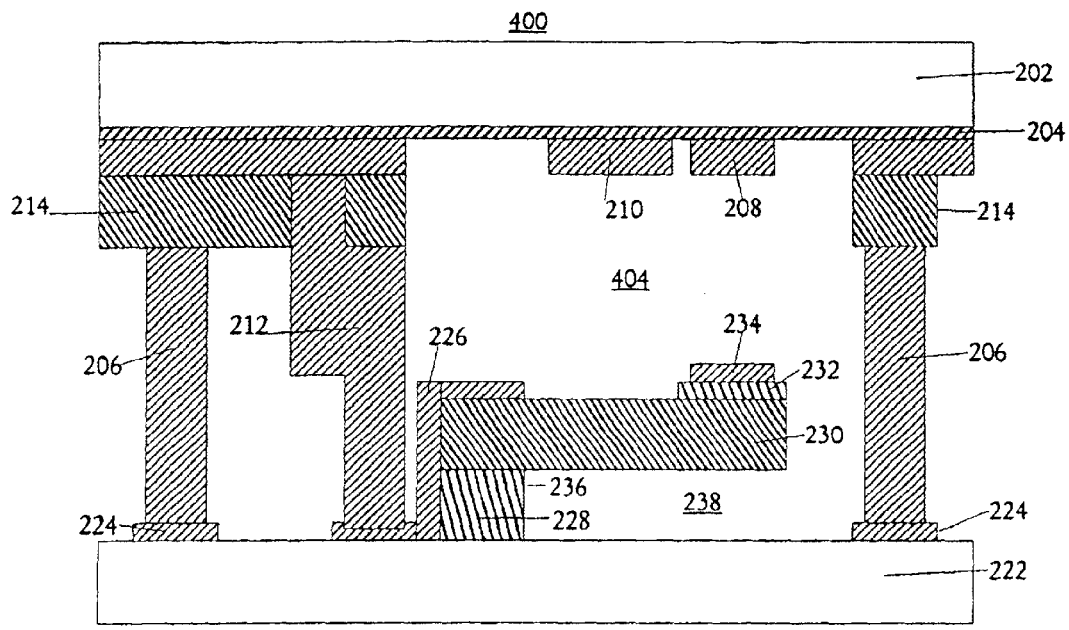
FIG. 4a is a cross-sectional view of an assembled micro-switch 400, fabricated in accordance with the present invention.
Figure 4B:
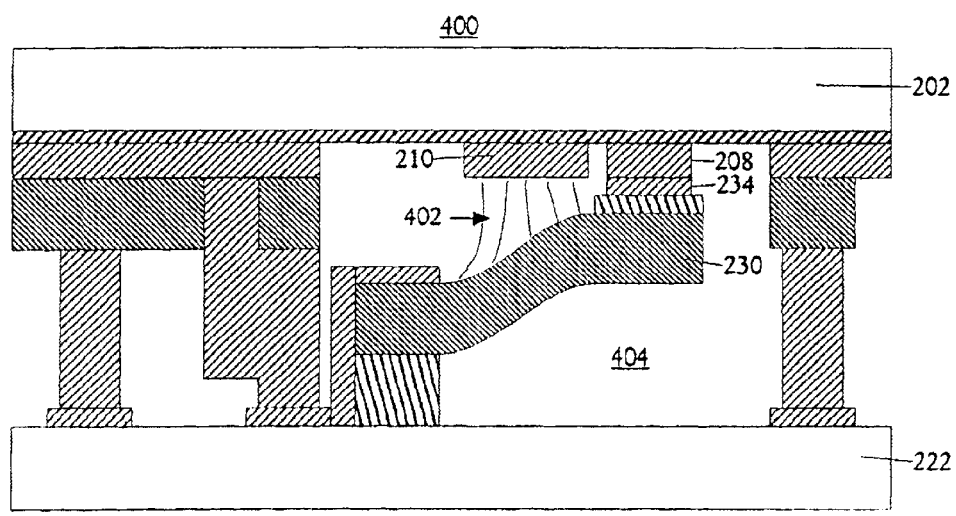
FIG. 4b is a cross-sectional view of the micro-switch 400 shown in FIG. 4a in its "activated" state.

Referring to FIG. 2a, there is shown a cross-sectional view of one embodiment of a lid assembly 200 for a micro-switch 400 shown in FIGS. 4a and 4b, which switch is fabricated in accordance with the present invention. The lid assembly 200 is fabricated by depositing layers of materials in a predetermined hierarchy using a process described with respect to FIG. 7. As will be described below, the lid assembly 200 is bonded to a base assembly 220 (FIG. 2b) to form a hermetically sealed micro-switch 400, as shown in FIGS. 4a and 4b. While a hermetic seal is preferred, other seals can be employed with the present invention, including but not limited to vacuum seals and gross-leak seals. FIG. 3a shows a top plan view of the lid assembly 200. The description of the lid assembly 200 will refer to both FIGS. 2a and 3a.

In one embodiment of the present invention, the lid assembly 200 includes substrate 202, insulating film 204, seal ring 206 (316), signal path 208 (300, 302), actuator 210 (310), anchor contact bump 212 (312), and insulating ring 214 (314). The substrate 202 can be made of any silicon, but is preferably made of high-resistivity silicon, glass or quartz and provides a common support structure for the microstructures in lid assembly 200. Other materials having differing resistivities can be used for the substrate 202, including but not limited to gallium arsenide, indium phosphide, indium gallium aresenide, sapphire, silicon-on-insulator, silicon-on-sapphire, polysilicon, amorphous silicon, plastic, or any combination of the these materials. The substrate 202 is coated with the insulating film 204, which is preferably made of silicon nitride, but other materials can be used, such as silicon oxide or ceramic. In this particular embodiment, the insulating film 204 acts as a diffusion barrier between the substrate 202 and a plurality of conductive traces 300, 302, 304, 306, as described below with respect to FIG. 3*a*.

Referring to FIG. 3*a*, the signal path 208 preferably comprises an input line 300 and an output line 302 separated by a gap 308, which serves as a barrier to signals (e.g., RF signals) transmitted on the input line 300. To improve performance of the micro-switch 400, a co-planar waveguide (CPW) structure can be used as the input line 300 and the output line 302. Although only one signal path 208 is shown in this embodiment, the present invention can employ one or more signal paths, each having one or more gaps. The one or more signal paths 208 can be disposed in the lid assembly 200 or the base assembly 220 or both. The signal path 208 is preferably made of metal, including but not limited to gold, titanium, titanium nitride, tantalum, tantalum nitride, copper, aluminum, tungsten, solders, metal amalgams, gallium, mercury, tin, lead, indium, palladium, thallium, bismuth, or any combination of these metals.

Also shown in FIG. 3*a*, is actuator driveline 304, which terminates in the actuator 310 (210) and anchor ground line 306, which terminates in the anchor contact bump 312 (212). The actuator driveline 304 provides the actuator 310 with an AC or DC actuation voltage in either positive or negative form. The actuation voltage causes the actuator 310 to apply a force 402 on the movable structure 230, as described with respect to FIG. 4*b*. The anchor ground line 306 provides an electrical ground for the actuation voltage. Preferably, the actuator 310 is an electrode capable of establishing an electric field, but one or more actuators of various types may be used with the present invention, including but not limited to electrostatic, capacitive, electromagnetic, magnetic, scratch drive, membrane capacitive, thermal, electro-thermal, shape memory alloy, mechanical and any combination of the above actuators.

The conductive traces 300, 302, 304, 306, are coupled to one or more wire bond pads (not shown) located outside the insulating ring 314 (214) using wire bonding or tab bonding techniques. Preferably, the connections to the wire bond pads run under the insulating ring 314 (214), so that they do not short the metal seal ring 316, as shown in FIG. 3*a*. The insulating ring 314 (214) overlies the conductive traces 300, 302, 304, 306, in a ring-shaped pattern. This pattern is substantially a mirror image of a seal-landing ring 320, which is described with respect to base assembly 220. The insulating ring 314 (214) pattern can be any closed curve, but is preferably a square pattern as shown in FIG. 3*a*. The insulating ring 314 (214) is preferably formed of silicon dioxide, since it has a relatively low dielectric constant, but is thermally and mechanically robust. The insulating ring 314 (214) is preferably about 2 microns in thickness, to ensure adequate electrical isolation between the conductive traces 300, 302, 304, 306, and the seal ring 314 (214). In this particular embodiment, the seal ring 316 (206) overlies and is substantially aligned with the insulating ring 314 (214), as shown in FIG. 3*a*. Alternatively, the insulation ring 314 (214) and the seal ring 316 (206) can be formed in the base assembly 220 instead of the lid assembly 200.

Although the seal-ring 316 (206) is preferably made of metal with little or no surface oxide (e.g., a pure, soft, bright gold), other electrically conductive materials having differing resistivities can be used for the other conductive elements 300, 302, 304, 306, 310, 312. These materials include, but are not limited to metals such as gold, titanium, titanium nitride, tantalum, tantalum nitride, copper, aluminum, tungsten, solders, metal amalgams, gallium, mercury, tin, lead, indium, palladium, thallium, bismuth, or any combination of these metals.

Although the insulation ring 314 (214) and the seal ring 316 (206) are shown as part of the lid assembly 200, the insulation ring 314 (214) and the seal ring 316 (206) can be part of the base assembly 220 or part of both the lid and base assemblies 200, 220.

Base Assembly

Referring to FIG. 2*b*, there is shown a cross-sectional view of one embodiment of a base assembly 220 for the micro-switch 400, fabricated in accordance with the present invention. The base assembly 220 is fabricated by depositing layers of materials in a predetermined hierarchy using a process described with respect to FIG. 8. As will be described below, the base assembly 220 is bonded with the lid assembly 200 (FIG. 2*a*) to form the hermetically sealed micro-switch 400 shown in FIGS. 4*a* and 4*b*. FIG. 3*b* shows a top plan view of the base assembly 220. The description of the base assembly 220 will refer to both FIGS. 2*b* and 3*b*.

In one particular embodiment of the present invention, the base assembly 220 includes substrate 222, seal-landing ring 224 (320), anchor contact 226 (318), pedestal 228, movable structure 230 (326), isolation pad 232, and contact pad 234 (322). The substrate 222 is preferably formed of single-crystal silicon and provides a common support structure for the microstructures in the base assembly 220. Other materials can be used for the substrate 222, including those materials described with respect to substrate 202. The pedestal 228 overlies the substrate 222 and is preferably made of silicon dioxide but other materials may be used, such as germanium or graphite. The pedestal 228 provides support for the movable structure 230 and a sidewall 236, which together with the movable structure 230 and the substrate 222 defines a gap 238. The gap 238 is typically very small (e.g., on the order of about 2 um in the vertical dimension). It provides the movable structure 230 with at least one degree of freedom within a sealed cavity 404, as shown in FIG. 4*b*.

Although the embodiment shown in FIG. 2*b* employs a single cantilever as the movable structure 230, one or more movable structures 230 can be employed, together with one or more signal paths, to create variety of MEMS switches for switching one or more signals, including but not limited to single pole single throw, single pole double throw, single pole multiple throw, and multiple pole multiple throw configurations. Such configurations may require one or more additional substrates and movable structures. Moreover, the movable structure 230 need not be supported at one end by a pedestal, but can also be supported at several locations by one or more pedestals or no pedestals (e.g., fixed directly to substrate 222). For example, the cantilever beam 230 shown in FIG. 2*a* can be supported in its center by a single pedestal, which acts as a pivot for the cantilever beam to move in a "see-saw" fashion, each free end of the cantilever beam bearing one or more contact pads 234 for bridging one or more gaps 308 in one or more signal paths 208 located on substrate 202 and/or and substrate 222.

The movable structure 230 (326) is preferably formed of polysilicon and doped with a dopant so that is it conductive (e.g., phosphorus), but can also be formed of monocrystalline silicon. The anchor contact 226 (318) preferably is deposited at the anchored end of the movable structure 230 (326) and provides an electrical ground for the actuation voltage. The free end (distal end) of the movable structure 230 (326) bears isolation pad 232, which is preferably composed of a silicon nitride layer, for isolating the actuation voltage from the signals. The contact pad 234 (322) overlies the isolation pad 232 and is used to bridge the gap 308 between the input line 300 and the output line 302. The location of the isolation pad 232 (and therefore the contact pad 234) on the movable structure 230 is selected to ensure that the contact pad 234 (322) bridges the gap 308 when the actuator 210 (310) is activated. Preferably, the shape and width of the contact pad 234 (322) is selected to achieve this purpose.

In this particular embodiment, the movable structure 230 (326) lies under the contact pad 234 (322), and therefore is deposited on the substrate 222 before the contact pad 234 (322) in the fabrication process flow, as illustrated in FIGS. 8A and 8B. This preferred configuration allows the polysilicon to be annealed at high temperatures (above 400° C.) for the movable structure 230 (326), without causing the contact pad 234 (322) to melt, delaminate, or interdiffuse with other material layers.

The seal-landing ring 224 (320) surrounds the movable structure 230 (326) and is preferably about 1.5 microns thick in its vertical dimension and has a wall thickness in the range of about 5–20 microns. The seal landing ring 224 (320), together with the seal ring 206 (316) bonds the lid assembly 200 to the base assembly 220, forming a hermetic seal around the movable structure 230 (326). The movable structure 230 (326) includes etch access holes 324, which facilitate removal of material underlying the movable structure 230 (326), as described with respect to FIGS. 8A and 8B.

Assembled Micro-Switch

Referring to FIG. 4a, there is shown cross-sectional views of one embodiment of an assembled micro-switch 400 fabricated in accordance with the present invention. Preferably, a plurality of lid assemblies 200 are processed on a first wafer and a plurality of base assemblies 220 are processed on a second, separate wafer. This preferred configuration enables the conductive traces and other metal elements to be processed on the first wafer using the appropriate annealing temperatures for such metals (e.g., below 300° C.) and the MEMS structures (e.g., movable structure 230) to be processed on the second wafer using the appropriate annealing temperatures for structures (e.g., above 400° C. for polysilicon).

Although the micro-switch 400 is shown with a cantilever beam as the movable structure 230, the present invention is not limited to this preferred configuration. For example, the movable structure 230 can be any type of structure (e.g., T-shaped structure, membrane structure). Moreover, the micro-switch 400 can be configured to operate in an electrically closed state when in its deactivated state (i.e., normally closed) or in an electrically opened state when in its deactivated state (i.e., normally open), as shown in FIGS. 4a and 4b. Alternatively, the movable structure 230 can include a signal path for transmitting signals from the lid assembly 200 to the base assembly 220 or vice-versa depending on the configuration of the micro-switch 400. The location of the actuator 310 on the substrate 202 can vary between the contact pad 234 (322) and the anchor contact 226 (318).

Operation of Micro-Switch

Referring to FIG. 4b, there is shown the assembled micro-switch 400 in its "activated" state. In operation, an RF signal is launched into the input line 300 of the micro-switch 400. Because of the gap 308, the signal cannot reach the output line 302. If an actuation voltage is applied to the actuator 210 (310), a force 402 is established, which pulls the movable structure 230 upward towards the substrate 202 (i.e., the movable structure 230 flexes upwards), until the contact pad 234 (322) bridges the gap 308 between the input line 300 and the output line 302, thereby allowing the signal to propagate through the micro-switch 400.

Applications for the assembled micro-switch 400 include but are not limited to, mobile phones, portable one-way and two-way radios, satellite phones, base stations, mobile Internet access devices, fixed location Internet access devices, radar collision sensing, Bluetooth compliant devices, wireless networks, or any combination of these applications.

Alternate Layouts

Figure 1A:
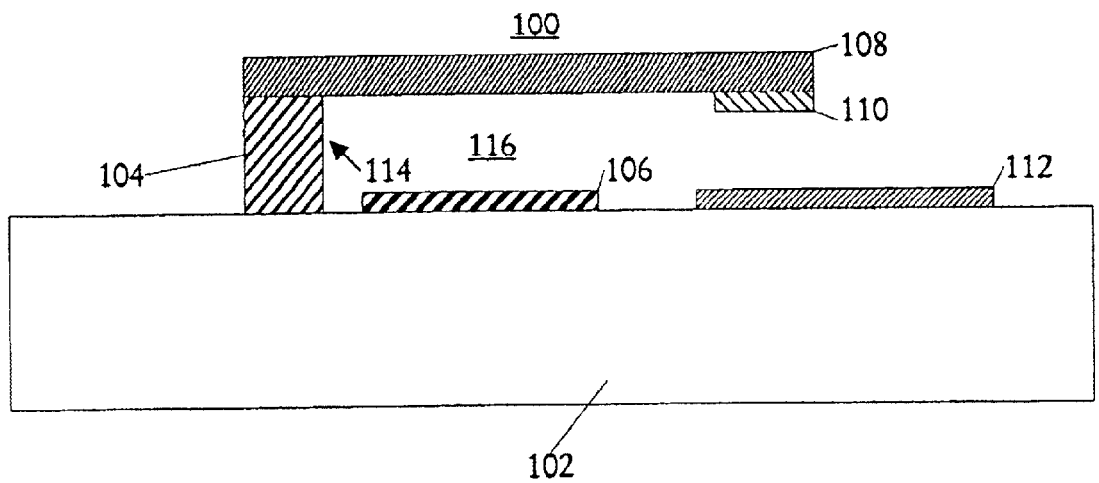
FIG. 1a is a cross-sectional view of a prior art micro-switch 100 shown in its "deactivated" state.
Figure 1B:
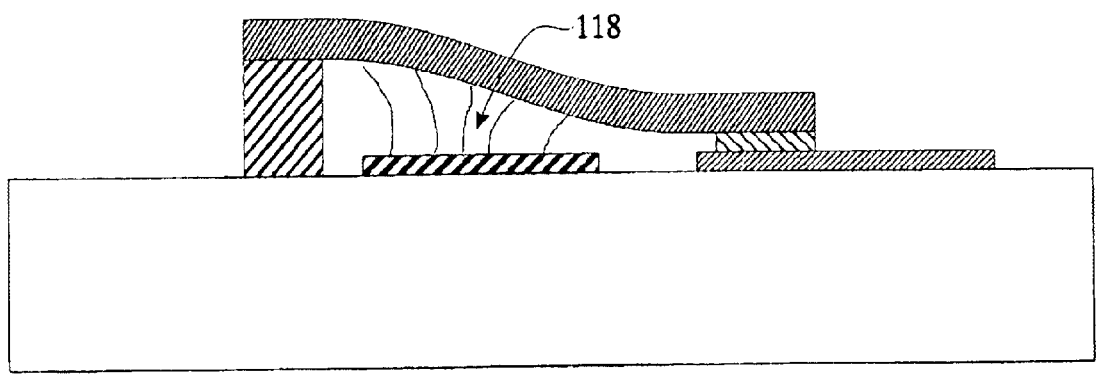
FIG. 1b is a cross-sectional view of the prior art micro-switch 100 shown in FIG. 1a in its "activated" state.
Figure 5:
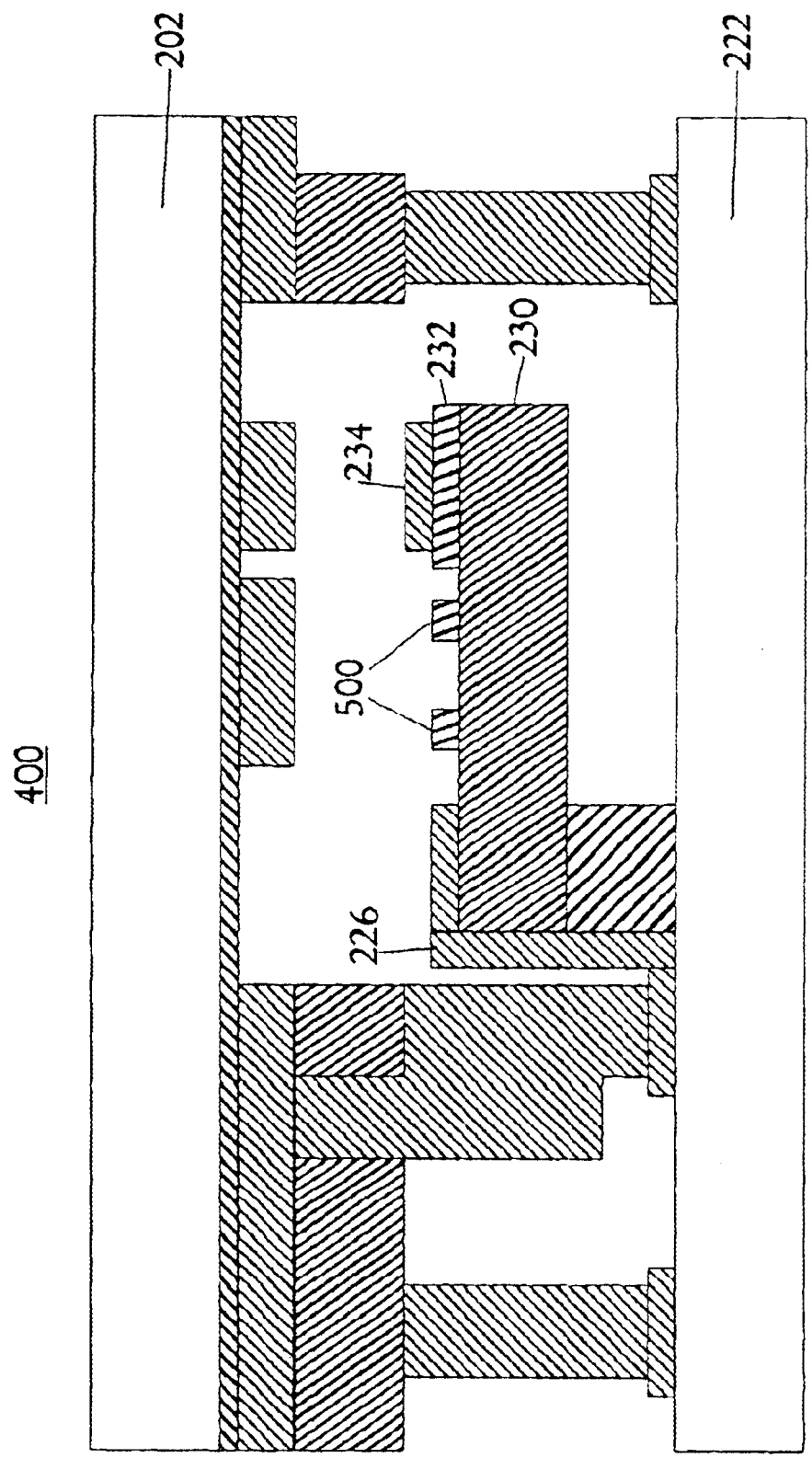
FIG. 5 is a cross-sectional view of the micro-switch 400 shown in FIG. 4a, including dielectric spacers.

Referring to FIG. 5 (with reference to FIGS. 1a and 4b), there is shown a cross-sectional view of the micro-switch 400, including dielectric spacers 500 located between the isolation pad 232 and the anchor contact 226. In the past, a contiguous dielectric layer (e.g., silicon nitride) was often used as an isolation layer between the cantilever 108 and the actuator 210. The two-substrate process flow described with respect to FIGS. 7 and 8, enables such dielectric layer (e.g., the same dielectric layer used to pattern the isolation pad 232) to be patterned and etched into one or more discrete islands, hereinafter referred to as dielectric spacers 500. This is advantageous because it reduces the total area of dielectric material. Dielectric materials tend to accumulate charge over time and through use. This accumulated charge can cause a shift in the required actuation voltage or sticking of the movable structure 230. Reducing the area of dielectric material reduces these negative effects due to the accumulated charge.

Figure 6A:
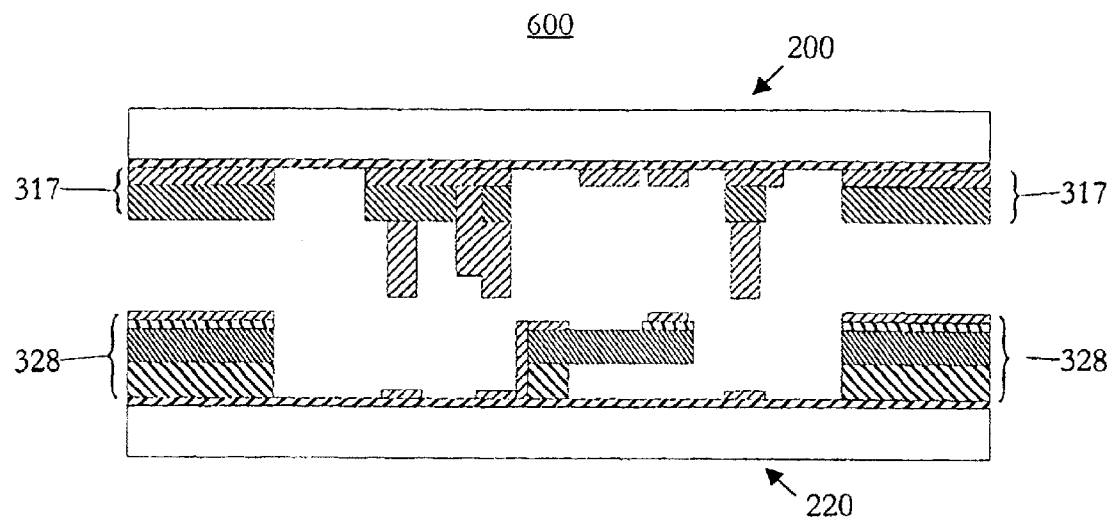
FIG. 6a is a cross-sectional view of the micro-switch 400 shown in FIG. 4a, including upper and lower mechanical stops 317, 328.
Figure 6B:
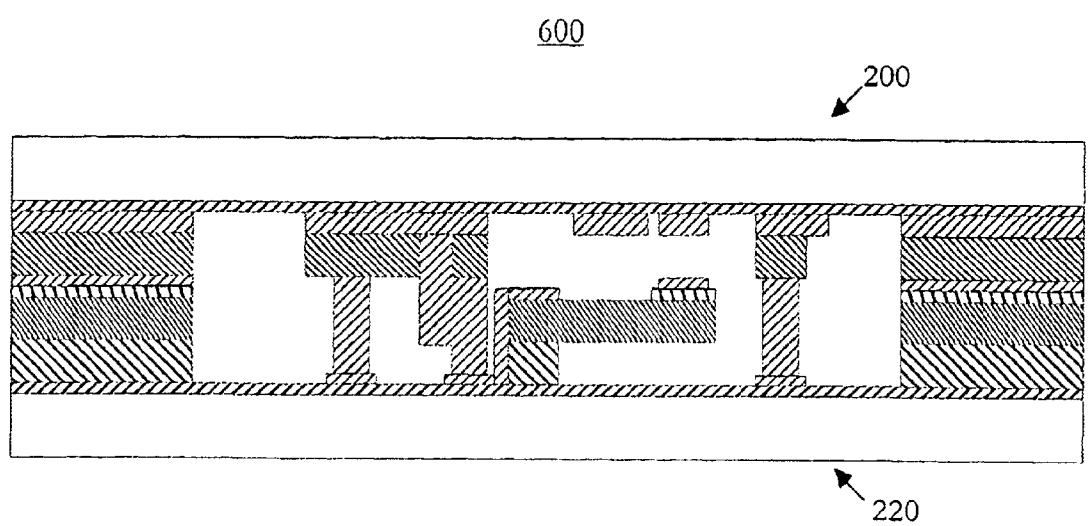
FIG. 6b is a cross-sectional view of the micro-switch 400 shown in FIG. 6a after final bonding.

Referring to FIGS. 6a and 6b, there are shown cross-sectional views of the micro-switch 600. The micro-switch 600 is similar to the micro-switch 400, but includes upper mechanical stops 317 and lower mechanical stops 328. FIG. 6b shows the microswitch 600 after the final bonding step, as described below with respect to FIGS. 7 and 8. The upper mechanical stops 317 are part of the lid assembly 200 and the lower mechanical stops 328 are part of the base assembly 220, as show in FIGS. 3a and 3b, respectively. The mechanical stops 317, 328, are used to provide a consistent gap between the movable structure 230 and the substrate 202. These mechanical stops 317, 328, are preferably comprised of the same layers used to fabricate the micro-switch 400, as shown in FIG. 6a.

Integration with Other Devices

One or more micro-switches can be integrated with one or more passive and active devices, including but not limited to capacitors, inductors, filters, low-noise amplifiers, power amplifiers and phase shifters. For example, one or more micro-switches can be fabricated as described above with at least one passive component (e.g., one or more capacitors, inductors and/or phase shifters) or at least one active component (e.g., one or more power amplifiers), fabricated on at least one of the two substrates 202, 222, with at least one electrical interconnection (e.g., via conductive layers, wire bonding, tab bonding) connecting at least one of the fabricated components (e.g., anchor contact 226) with one or more passive components. Alternatively, the passive components do not need to be fabricated on either of the two substrates 202, 222, but can be electrically interconnected to one or more micro-switches (e.g., via conductive layers).

Process Flow for Lid Assembly

Figure 7:
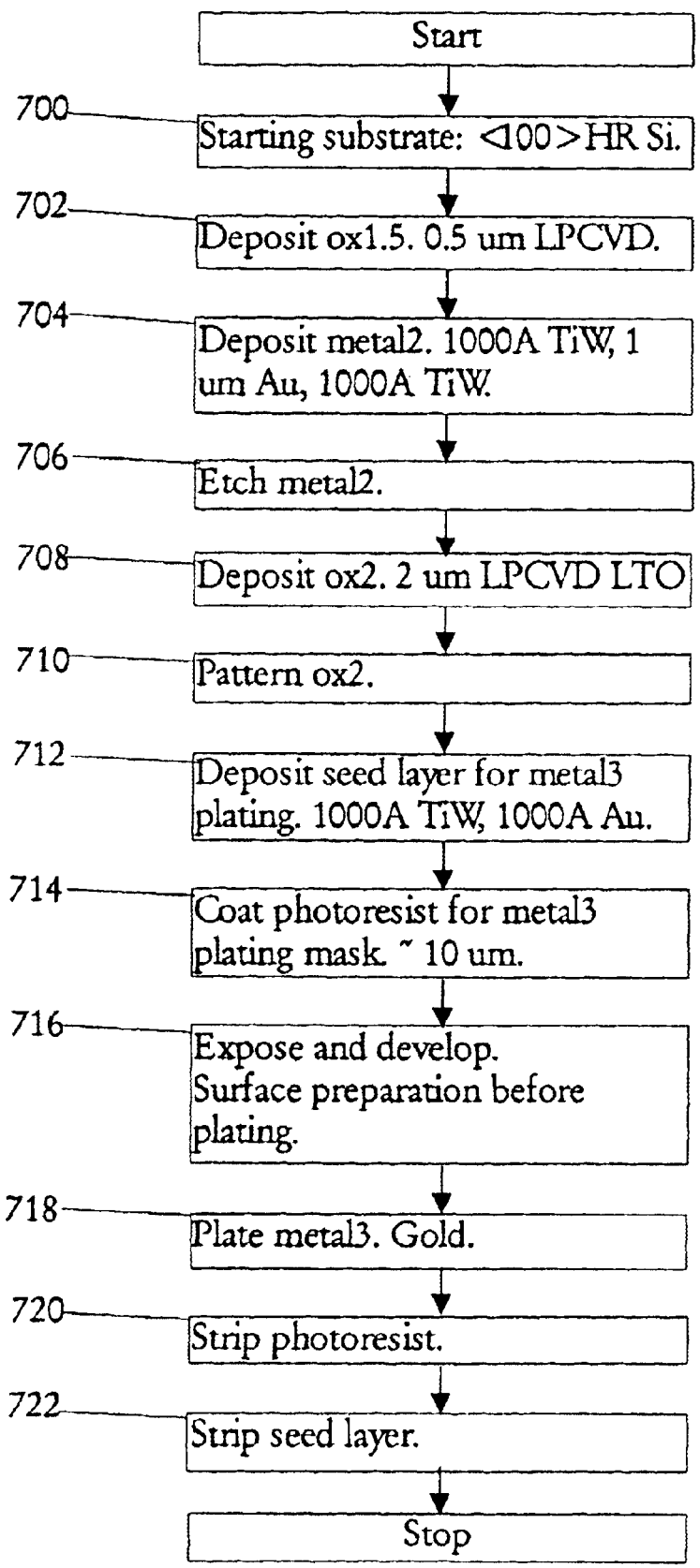
Figure 8I:
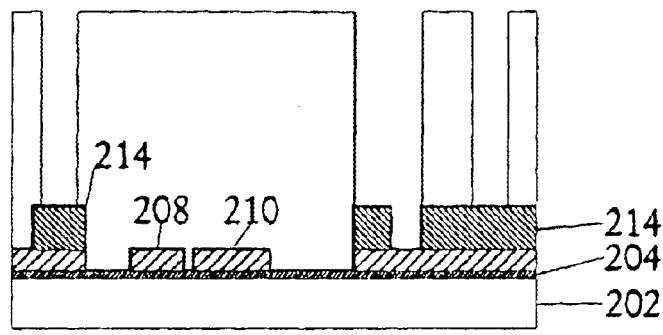
Figure 8J:
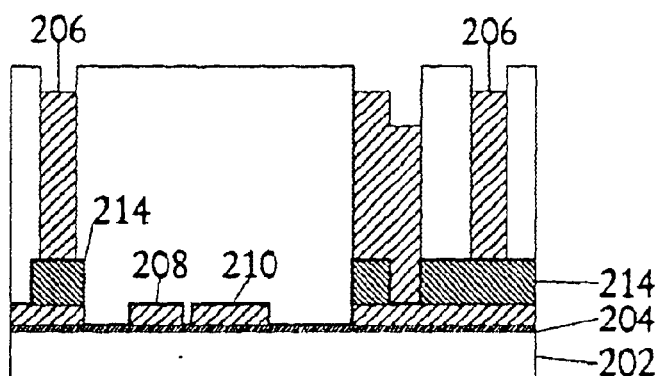
Figure 8K:
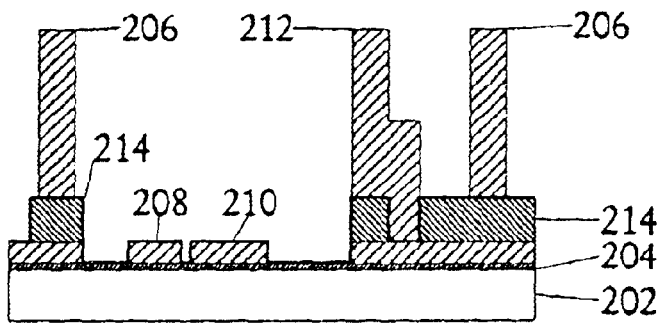
Figure 8L:
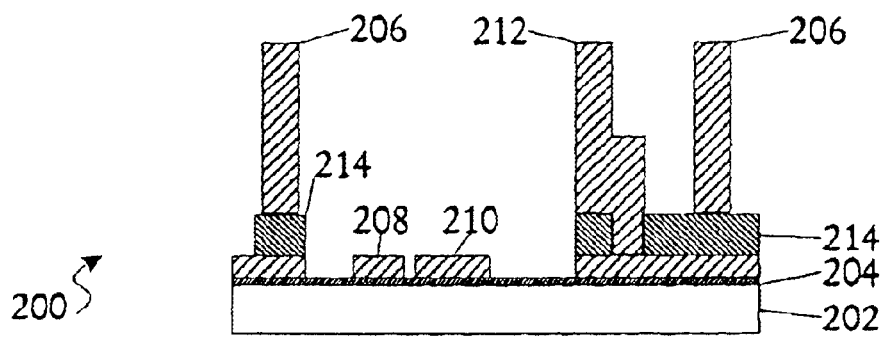

Referring to FIG. 7 (with reference to FIGS. 8a–l showing corresponding cross-sectional views of the process flow), there is shown a flow diagram of one embodiment of a process flow for fabricating a lid assembly (e.g., lid assembly 200). The process starts 700 with a glass, quartz, or high-resistivity silicon substrate (e.g., substrate 202). The substrate is coated 702 with an insulating film (e.g., insulating film 204) comprising about 1 micron of silicon dioxide (oxide 1.5). Deposited 704 on the insulating film is about 1000 A of sputtered TiW, about 1–2 um of gold and about 1000 A of TiW. The TiW acts as a diffusion barrier, and also provides adhesion between the gold and the adjoining layers above and below. Hereinafter, this tri-layer is also referred to as metal2.

Metal2 is wet etched 706 to define conductive traces (e.g., input line 300, output line 302) and wire bond pads. About 2 microns of silicon dioxide (ox2) is deposited 708 over the conductive traces. Ox2 is patterned 710 to form a insulating ring (e.g., insulating ring 214). Step 710 can be performed using a wet etchant, such as 5:1 BOE, or a dry etch, such as CH4/CHF3/He. The insulating ring can have any desired width, but is preferably in the range of about 20 to about 50 microns.

Next, the wafer is coated 712 with a seed layer for electroplating. The seed layer preferably consists of about 1000 A of TiW, followed by about 1000 A of Au, preferably sputter deposited. A stencil mask is formed 714, preferably using a planarizing resist such as SJR5740. The stencil mask is formed 714 with an opening in the shape of a ring, nominally overlying the insulating ring. An opening in the shape of a small square, roughly 10×10 um in size, is also provided, nominally overlying the anchor contact 226. The resist is exposed and developed 716 to prepare the surface for plating. A deformable metal is plated 718 to a thickness of about 8 microns. This is preferably a pure, soft, bright gold. Hereinafter, this layer is also referred to as metal3. Finally, the resist is stripped 720 and the exposed seed layer is stripped 722 to finish the process flow.

Process Flow for Base Assembly

Figure 9:
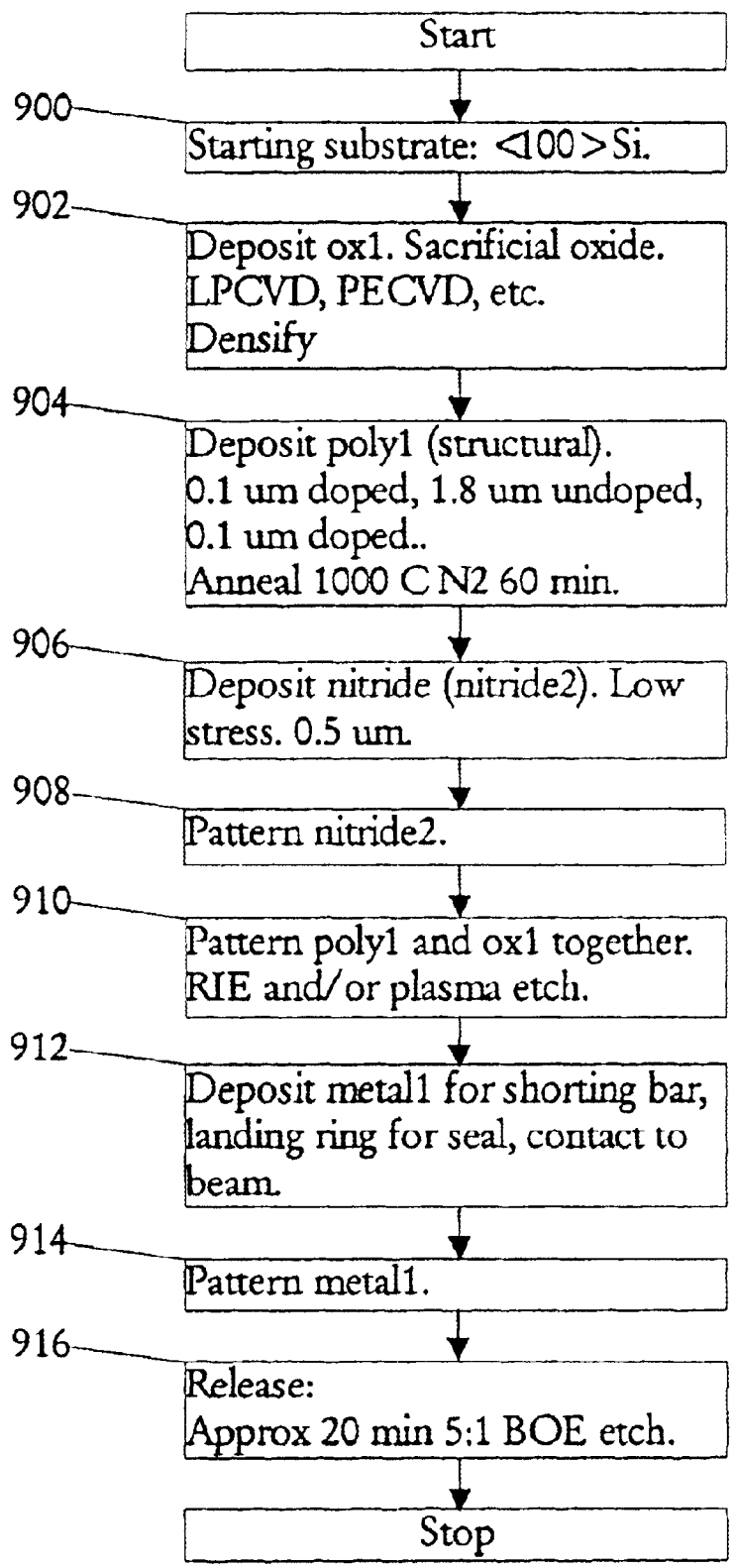
FIG. 9 is flow diagrams showing the process flow steps used in the fabrication of the base assembly 220 shown in FIG. 2b.
Figure 10A:
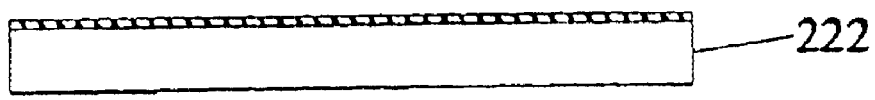
FIGS. 10a–i are cross-sectional views showing the process flow steps used in the fabrication of the base assembly 220 shown in FIG. 2b.
Figure 10B:
Figure 10C:
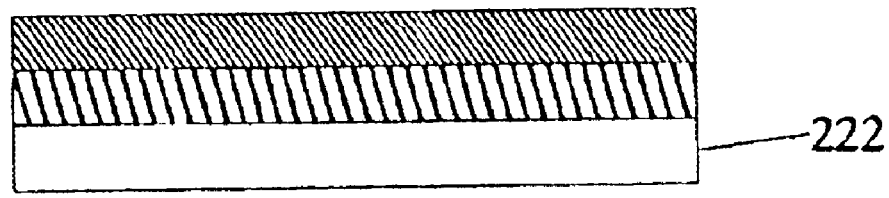
Figure 10D:
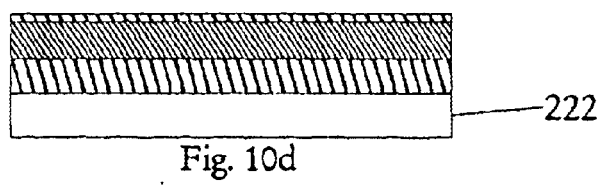
Figure 10E:
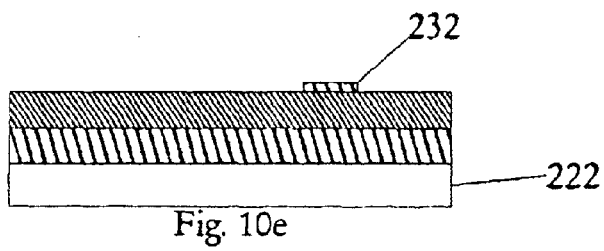
Figure 10F:
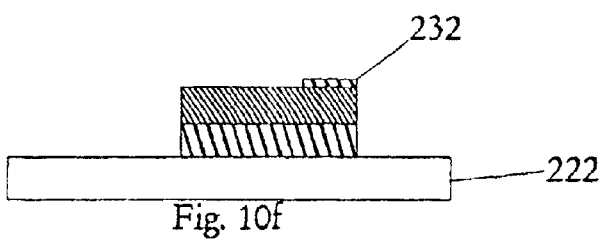
Figure 10G:
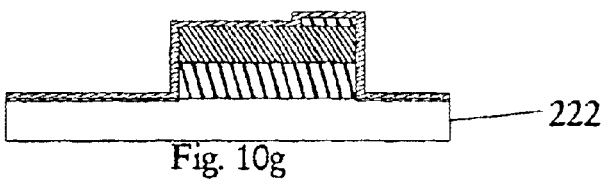
Figure 10H:
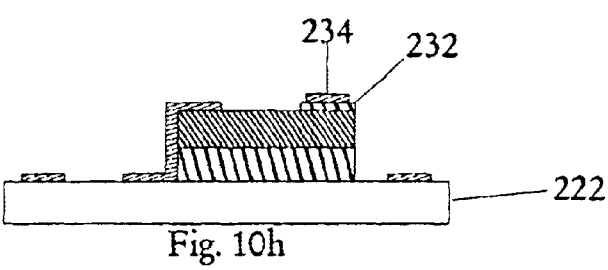
Figure 10I:
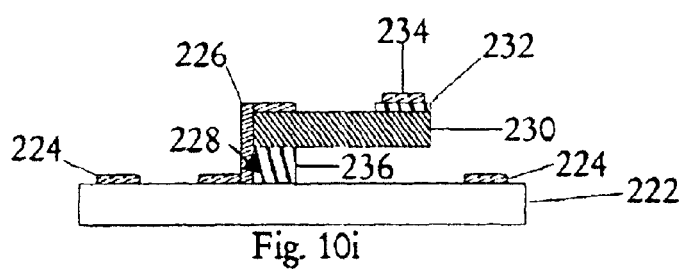

Referring to FIG. 9 (with reference to corresponding FIGS. 10*a–i* showing cross-sectional views of the process flow), there is shown a flow diagram of one embodiment of a process flow for fabricating a base assembly (e.g., base assembly 220). The process starts 900 with a silicon substrate (e.g., substrate 222). The substrate is coated 902 with about 2–3 microns of silicon dioxide (ox1). The silicon dioxide is then doped 904 with about 2 microns of polycrystalline silicon (poly1), either in-situ, or from symmetrical (upper and lower) layers of dopant source material, such as thin layers of doped polysilicon. The poly1 layer, together with the ox1 layer, provide an intermediate structure from which a cantilever (e.g., movable structure 230) will be formed in later process flow steps. The polysilicon is annealed for about 60 minutes at about 1000° C., in nitrogen, to distribute the dopant and reduce stress. About a 60 second RTA is performed in nitrogen to further reduce stress. About 0.5 microns of silicon nitride (nitride1; preferably low-stress) is deposited 906 over the polysilicon. The nitride2 layer is patterned 908 to form an insulating pad (e.g., insulating pad 232) at what will become the free end (distal end) of a cantilever. Additionally, one or more small pads (e.g., dielectric spacers 500) of nitride2 can be distributed over the area of the movable structure, to act as insulating spacers and mechanical stops (e.g., mechanical stops 328) between the cantilever and the actuator, as shown in FIG. 5. The poly layer is patterned 910 to define the cantilever. Preferably, one or more etch access holes (e.g., etch access holes 324) are provided in the cantilever, except in the area that is to be supported by an anchor pedestal (e.g., pedestal 228). The wafer is preferably sputter coated 912 with about 1000 A of TiW, followed by about 1 um of Au. Hereinafter, this layer is also referred to as metal1.

The metal1 layer is etched 912, preferably using a wet etchant such as KI, to define a contact pad (e.g., contact pad 234), the cantilever's ground contact (e.g., anchor contact 226), and a metal seal ring (e.g., seal ring 206). Preferably, a timed wet etch of ox1 is performed in HF. The etch access holes allow the HF to undercut the main body of the cantilever. The wafer is removed from the etch and rinsed in DI water, before the pedestal area is etched 916 away. This results in the finished cantilever.

Bonding Procedure

One embodiment of a bonding procedure is described below in accordance with the present invention. Other bonding processes, however, may be employed with the present invention, including but not limited to, use of different temperatures, different pressures, different ambients, ultrasonic agitations, megasonic agitation, surface cleaning or any combination of the above techniques.

Figure 11A:
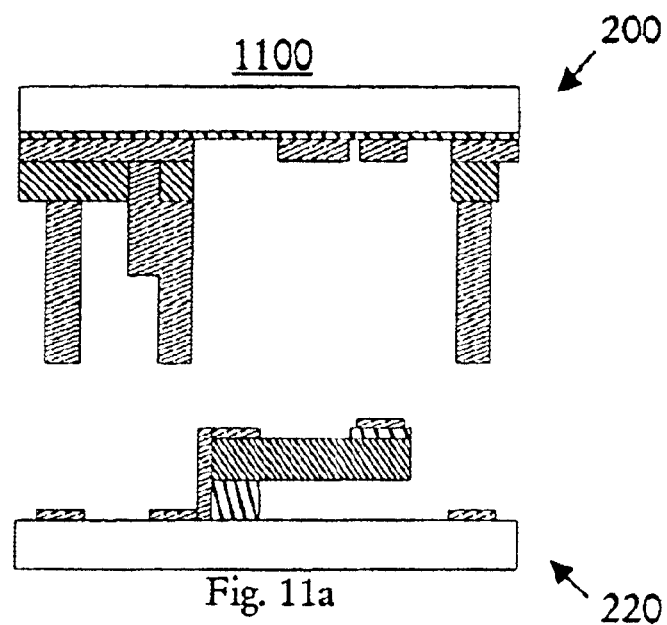
Figure 11B:
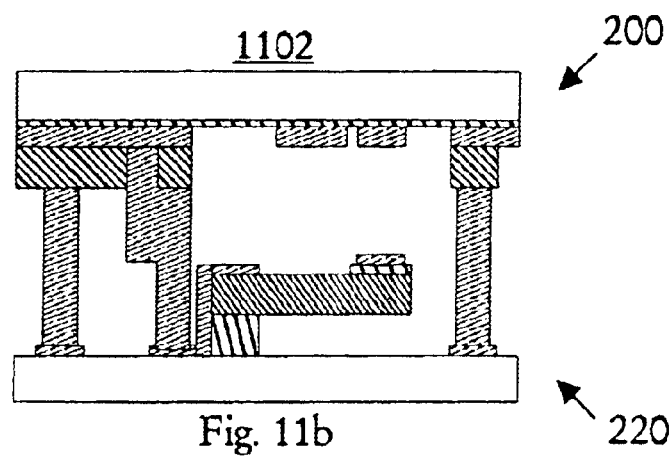
Figure 11C:
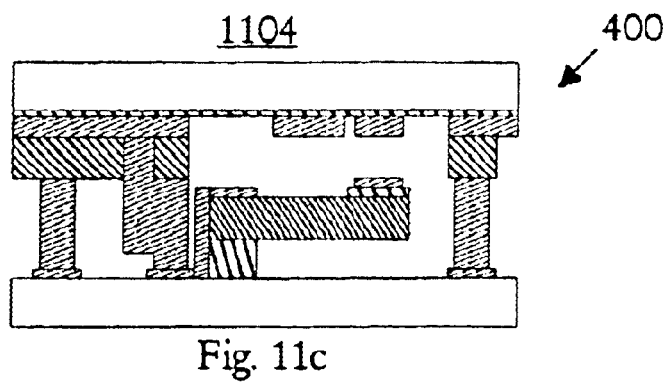

Referring to FIGS. 11*a–c*, there is shown a wafer-scale bonding technique in accordance with the present invention. The first wafer (the wafer bearing the lid assemblies) and the second wafer (bearing the base assemblies) are aligned 1100 and tack bonded 1102, using, for example, a Karl Suss MA/BA-6 bond aligner and SB-6 wafer bonder. Preferably, a gold thermocompression recipe is used for tack bonding, e.g. about 300° C. in inert gas or vacuum, approximately a 1 minute bond time, at full pressure (about 2–3 bar). To achieve a final bond 1104, the wafers are preferably transferred to a hydraulic press apparatus, where approximately about 100–200 bar is applied, at a temperature of about 270°–300° C., for about 10–20 minutes. This is a relatively long "soak," which enables the gold to plastically deform and create a hermetic seal where the two rings bond (e.g., seal ring 206 and seal-landing ring 224). The long soak time also enables a suitably large degree of plastic deformation without excessive applied pressure. If a shorter soak time is used, higher pressures are required, which leads to cracking of the wafers. The wafers are preferably constrained to prevent lateral shearing or shifting of one wafer relative to the other, while this higher level of pressure is applied. This may be achieved by placing the wafer between two metal plates, of diameter larger than the wafers'. The two plates are bolted or otherwise secured together at a number of points around their perimeters. Spacers are used to create a gap between the plates, equal to the combined thickness of the two wafers, plus about 25–100 um. The thickness and diameter of the plates is chosen so that they can flex to allow compression of the wafers, coming into contact against the wafers with relatively little applied pressure (e.g. about 10% of the full applied pressure of about 200 bar). In this way, the two metal plates act to prevent lateral motion of the wafers during the compression step. The soak time is preferably adjusted to achieve a compression of about 50% in the electroplated gold layer. This leads to a gap of about 2 um between the contact pad (e.g., contact pad 234) and the signal path (e.g., signal path 208).

An advantage of the techniques described above is that each lid/base assembly pair is individually bonded together to form a sealed cavity 404 adapted to house the movable structure 230 (FIG. 4*a*) so that it can move freely under the influence of the actuator 210. The sealed cavity 404 can significantly increase the lifetime of the micro-switch 400 by sealing off the microstructures from harmful contaminants in the environment.

Although the bonding procedure described above employs wafer-scale bonding techniques, the present invention is equally applicable to die-scale bonding techniques, including the bonding of any subset of devices on a wafer or other substrate (e.g., nxm array of devices).

Dicing Procedure

Once the micro-switches 400 are assembled, a dicing saw is used to expose the bond pads patterned on the first wafer (the wafer bearing the lid assemblies). This is achieved by making cuts in the second wafer (the wafer bearing the base assemblies). The micro-switches 400 are then singulated by cutting with the dicing saw completely through the bonded wafers. The micro-switches 400 are protected during dicing by their respective hermetic seals during the wafer-scale bonding step. In the past, MEMS devices were generally diced before packaging. Particulates and water present during the dicing process would damage devices, drastically lowering yield.

Second-level Packaging

The singulated devices are packaged in a conventional manner using standard IC chip packaging techniques. Preferably, this is done using a surface-mount plastic package, or a wafer-scale package, such as used for stacked-chip devices such as DRAMs.

The above description is included to illustrate the operation of the preferred embodiments and is not meant to limit the scope of the invention. The scope of the invention is to be limited only by the following claims. From the above discussion, many variations will be apparent to one skilled in the relevant art that would yet be encompassed by the spirit and scope of the invention. For example, to ensure that at least about a 2 um gap between the contact pad and signal path is achieved in a repeatable, uniform manner, a two-layer structure may be substituted for the electroplated gold ring. In this case, the first layer would be formed of nickel or other relatively hard material. Nickel may be conveniently electroplated in this case. Subsequently, gold-tin alloy or other solder material would be electroplated on top of the nickel. The nickel layer here serves as a well-defined hard stop, determining the final thickness of the plated layer. In the bonding step, the gold-tin would melt and reflow, sealing the ring structure and forming electrical contacts, but taking on a negligible thickness. As an alternative to gold-tin, pure gold could be used. With adequate pressure and soak time, it may be expected that the gold layer would be compressed to negligible thickness. An additional alternative embodiment might employ polysilicon or other ceramic material as the mechanical stop. This material could be patterned to lie outside the active area of the device, but could conceivably occupy a larger surface area than the nickel in the embodiment above. The larger surface area would lead to reduced stress, and more reliable establishment of the desired vertical gap during the bond process.

What is claimed is:

1. A micro-switch, comprising:
   a first substrate and a second substrate bonded together to form a cavity;
   on the first substrate, at least one signal path that runs from inside the cavity to outside the cavity at at least two locations; and
   at least one movable structure on the second substrate, said movable structure comprising at least one conductive contact area, wherein at least one portion of said movable structure is inside said cavity, and the movable structure is moved in response to a force provided by an actuator, wherein a state of electrical contact of said micro-switch is changed by moving said movable structure, wherein said actuator is powered through at least one actuator drive line and at least one ground line, wherein said at least one actuator drive line and said at least one ground line run from inside said cavity to outside said cavity, said at least one actuator drive line being electrically connected to said actuator and said at least one ground line being electrically connected to an electrical common.

2. A micro-switch, comprising:
   a first substrate and a second substrate bonded together to form a cavity;
   on the first substrate, at least one signal path that runs from inside the cavity to outside the cavity at at least two locations; and
   at least one movable structure on the second substrate, said movable structure comprising at least one conductive contact area, wherein at least one portion of said movable structure is inside said cavity, and the movable structure is moved in response to a force provided by an actuator, wherein a state of electrical contact of said micro-switch is changed by moving said movable structure, wherein said movable structure is selected from a list of movable structures consisting of: a cantilever and a cantilever with at least one pedestal.

3. A micro-switch, comprising:
   a first substrate and a second substrate bonded together to form a cavity;
   on the first substrate, at least one signal path that runs from inside the cavity to outside the cavity at at least two locations; and
   at least one movable structure on the second substrate, said movable structure comprising at least one conductive contact area, wherein at least one portion of said movable structure is inside said cavity, and the movable structure is moved in response to a force provided by an actuator, wherein a state of electrical contact of said micro-switch is changed by moving said movable structure, wherein said first substrate and said second substrate are bonded together with a gold thermocompression bonding process.

4. The micro-switch of claim 3, wherein said gold thermocompression bonding process is performed below 400 degrees C. during bonding.

5. The micro-switch of claim 3, wherein said gold thermocompression bonding process is performed without heating said substrates during bonding.

6. A lid assembly for a micro-switch comprising:
   a substrate;
   a first insulating layer formed on the substrate;
   a first conductive layer formed on the substrate;
   at least one signal path formed in the conductive layer;
   a second insulating layer formed on the first conductive layer;
   an insulating ring formed in the second insulating layer;
   a second conductive layer formed on the second insulating layer;
   a first conductive ring formed in the second conductive layer, the first conductive ring substantially aligned with and overlying the insulating ring;
   a second substrate having a second conductive ring at least partially surrounding a movable structure, the first conductive ring on the second conductive layer substantially aligned with and overlying the second conductive ring around the movable structure, thereby forming a seal around the movable structure when the lid assembly is bonded to the second substrate;

at least two external signal contact points formed in the first conductive layer, said at least one signal path electrically connected to said at least two external signal contact points, and each contact point being outside the seal around the movable structure;

an actuator formed in the first conductive layer for providing a force on a movable structure on the second substrate; and at least one actuator drive line formed in the first conductive layer electrically connected to the actuator.

7. The lid assembly for the micro-switch of claim 6, wherein said at least one signal path formed in the conductive layer further comprises:

at least one gap separating said at least one signal path formed in the conductive layer into two electrically disconnected portions; and in at least one state of electrical contact of said micro-switch, said movable structure electrically connecting said two electrically disconnected portions.

8. The lid assembly for the micro-switch of claim 6, wherein said lid assembly includes at least one ground line that is electrically connected to an electrical common or ground.

9. The lid assembly for the micro-switch of claim 6, wherein said micro-switch is a portion of a device selected from the list of portions of a device consisting of: phase shifter, power amplifier, antenna, low-noise amplifier, filter, inductor, and variable capacitor.

10. A method of making a lid assembly for a micro-switch, the method comprising:

forming a first insulating layer on a first substrate;

forming a first conductive layer on the first substrate;

forming at least one signal paths in the first conductive layer;

forming at least two external signal contact points in the first conductive layer, each electrically connected to said at least one signal path;

forming an actuator in the first conductive layer for providing a force on a movable structure on a second substrate;

forming at least one actuator drive line in the first conductive layer electrically connected to the actuator;

forming a second insulating layer on the first conductive layer;

forming an insulating ring in the second insulating layer;

forming a second conductive layer on the second insulating layer;

forming a first conductive ring around a movable structure on a second substrate;

forming a second conductive ring in the second conductive layer, the second conductive ring in said second conductive layer substantially aligned with and overlying the insulating ring, the second conductive ring in the second conductive layer also substantially aligned with and overlying the first conductive ring around a moving structure on the second substrate; and bonding the first and second substrates together forming a sealed cavity and thereby sealing the movable structure, wherein the at least one signal path runs from inside the cavity to outside the cavity, and said at least one signal paths that runs from inside to outside the cavity is connected to an external signal contact point outside the cavity.

11. The method of making a lid assembly for a micro-switch of claim 10, wherein said at least one signal path electrically connected to at least two external signal contact points further comprises:

at least one gap in said at least one signal path, separating said at least one signal path into two electrically-disconnected sections; and in one state of electrical connection of said micro-switch, said movable structure electrically connecting said two electrically-disconnected sections.

12. The method of making a lid assembly for a micro-switch of claim 10, wherein said lid assembly further comprises at least one ground line that is electrically connected to an electrical ground or common.

13. The method of making a lid assembly for a micro-switch of claim 10, wherein said micro-switch is a portion of a device selected from the list of portions of a device consisting of: phase shifter, power amplifier, antenna, low-noise amplifier, filter, inductor, and variable capacitor.

14. A method of making a lid assembly for a micro-switch, the method comprising:

forming a first substrate with an insulating surface;

forming a first conductive layer on said insulating surface;

forming at least two signal contact points in said first conductive layer;

forming at least one signal path in said first conductive layer;

forming an actuator in said first conductive layer for providing a force on a movable structure on a second substrate, wherein said movable structure includes at least one conductive contact area;

forming at least one actuator drive line in said first conductive layer electrically connected to said actuator;

forming at least one ground line in said first conductive layer;

forming a first insulating layer on said first conductive layer;

forming an insulating ring in said first insulating layer;

forming a second conductive layer on said first insulating layer;

forming a first conductive ring around said movable structure on said second substrate;

forming a second conductive ring in said second conductive layer, the second conductive ring in said second conductive layer substantially aligned with and overlying said insulating ring, said second conductive ring in said second conductive layer also substantially aligned with and overlying said first conductive ring around said moving structure on said second substrate; and bonding said first substrate and said second substrate together forming a sealed cavity and thereby sealing said movable structure, wherein the at least one signal path runs from inside said cavity to outside said cavity at two locations, and said at least one signal path that runs from inside to outside said cavity is connected to said at least two signal contact points outside the cavity, said at least one actuator drive line and said at least one ground line running from inside the cavity to outside said cavity, each actuator drive line and each ground line being connected to at least one contact point outside said cavity.

15. The method of making a lid assembly for a micro-switch of claim 14, wherein said at least one signal path connected to said at least two contact points further comprises:

a gap in said at least one signal path separating said at least one signal path into two electrically-disconnected portions; and in at least one state of electrical contact, said at least one conductive contact area of said movable structure electrically connecting said two electrically-disconnected portions.

16. The method of making a lid assembly for a micro-switch of claim 14, wherein said micro-switch is a part of a device selected from the list of parts of a device consisting of: phase shifter, power amplifier, antenna, low-noise amplifier, filter, inductor, and variable capacitor.

17. The method of making a lid assembly for a micro-switch of claim 14, further comprising bonding said first substrate and said second substrate together with a gold thermocompression bonding process.

18. The method of making a lid assembly for a micro-switch of claim 17, wherein said gold thermocompression bonding process further comprises heatless bonding of said first substrate and said second substrate.

19. A micro-switch, comprising:
a first substrate and a second substrate bonded together to form a cavity;
on the first substrate, at least one signal path that runs from inside the cavity to outside the cavity at at least two locations; and
at least one movable structure on the second substrate, said movable structure comprising at least one conductive contact area, wherein at least one portion of said movable structure is inside said cavity, and the movable structure is moved in response to a force provided by an actuator, wherein a state of electrical contact of said micro-switch is changed by moving said movable structure, wherein said actuator is an electrostatic actuator.

20. A micro-switch, comprising:
a first substrate and a second substrate bonded together to form a cavity;
on the first substrate, at least one signal path that runs from inside the cavity to outside the cavity at at least two locations;
at least one movable structure on the second substrate, said movable structure comprising at least one conductive contact area, wherein at least one portion of said movable structure is inside said cavity, and the movable structure is moved in response to a force provided by an actuator, wherein a state of electrical contact of said micro-switch is changed by moving said movable structure, wherein said movable structure further comprises at least one layer of silicon, and at least one state of electrical contact of the micro-switch results from physical contact between said at least one conductive contact area and at least one portion of said first substrate; and
at least one insulating layer that electrically insulates one of said at least one conductive contact area from said at least one layer of silicon, wherein said at least one signal path has at least one gap separating said at least one signal path into two electrically disconnected portions, and during said at least one state of electrical contact, said at least one conductive contact area electrically connects said two electrically disconnected portions of said at least one signal path.

21. A micro-switch, comprising:
a first substrate with at least one signal path;
a second substrate, wherein said first substrate and said second substrate are bonded together with gold thermocompression bonding;

at least one seal ring that seals at least one hermetic cavity between said first substrate and said second substrate, wherein said at least one signal path runs from inside said hermetic cavity to outside said hermetic cavity at at least two locations, and said seal ring is comprised of gold;
at least one movable structure with at least one conductive contact area within said cavity, wherein said at least one movable structure is moved in response to a force provided by an actuator, and a state of electrical contact of the micro-switch can be changed by moving said at least one movable structure; and
means for powering said actuator.

22. The micro-switch of claim 21, wherein said means for powering said actuator further comprises at least one actuator drive line and at least one ground line, wherein said at least one actuator drive line is electrically connected to said actuator and said at least one ground line is electrically connected to a common.

23. The micro-switch of claim 21, further comprising:
a gap in said at least one signal path that separates said at least one signal path into two electrically-disconnected portions; and
in at least one state of electrical contact, said at least one conductive contact area of said movable structure electrically connecting said two electrically-disconnected portions
at least one insulating layer on said movable structure, wherein said insulating layer electrically insulates said at least one conductive contact area of said movable structure from the rest of said movable structure; and
in at least one state of electrical contact of said micro-switch, said at least one conductive contact area of said movable structure electrically connects said two electrically-disconnected portions of said signal path.

24. The micro-switch of claim 21, wherein said gold thermocompression bonding process further comprises heatless bonding of said first substrate and said second substrate.

25. The micro-switch of claim 21, wherein said seal ring is composed of low-outgassing materials.

26. The micro-switch of claim 21, wherein said seal ring is composed of low-outgassing, inorganic, non-solder materials.

27. The micro-switch of claim 21, wherein the electrical contact is selected from a list of electrical contacts consisting of: metal contact, capacitive, and shunt.

28. The micro-switch of claim 21, wherein at least one of said first substrate and said second substrate has at least one deformable metal layer shaped into a seal ring before said gold thermocompression bonding.

29. The micro-switch of claim 21, wherein said seal ring comprises metal layers deposited on said first substrate and said second substrate before bonding.

30. The micro-switch of claim 21, wherein said movable structure is fabricated on said second substrate.

31. The micro-switch of claim 21, wherein said movable structure is fabricated on said first substrate.

32. The micro-switch of claim 21, wherein at least one signal path runs in and out of said cavity through at least one via.

33. The micro-switch of claim 21, wherein at least one signal path runs in and out of said cavity at at least one location through at least one conductive layer deposited on said first substrate, wherein said at least one signal path is electrically isolated from at least one portion of said micro-switch with an insulating layer deposited on said first substrate.

34. The micro-switch of claim 21, wherein said micro-switch is part of a device selected from the list of parts of a device consisting of: phase shifter, antenna, low-noise amplifier, power amplifier, and filter.

35. The micro-switch of claim 21, wherein at least one signal path runs in and out of said cavity at at least one location through at least one conductive layer deposited on said second substrate, wherein said at least one signal path is electrically isolated from at least one portion of said micro-switch with an insulating layer deposited on said second substrate.

36. The micro-switch of claim 21, wherein said at least one movable structure further comprises at least one layer of silicon.

37. A micro-switch, comprising:
   a first substrate and a second substrate bonded together to form a cavity;
   at least one signal path on said first substrate that run from inside said cavity to outside said cavity in at least two locations;
   at least one movable structure on said second substrate within said cavity, wherein said at least one movable structure is moved in response to a force provided by an electrostatic actuator, and said at least one movable structure comprises at least one layer of silicon and at least one conductive contact area, wherein one state of electrical contact of said micro-switch results from physical contact between said at least one conductive contact area and at least one part of said first substrate; and
   means for driving said electrostatic actuator.

38. The micro-switch of claim 37, wherein said a least one signal path has a gap that separates said at least one signal path into two electrically-disconnected portions, and in one state of electrical contact of said micro-switch, said at least one movable structure electrically connects said two electrically disconnected portions.

39. The micro-switch of claim 38, further comprising an insulating layer that electrically insulates said at least one conductive contact area of said at least one movable structure from other portions of said at least one movable structure.

40. The micro-switch of claim 37, wherein said means for driving said electrostatic actuator further comprises at least one actuator drive line and at least one ground line, wherein said at least one actuator drive line is electrically connected to said actuator and said at least one ground line is electrically connected to a ground, said at least one actuator drive line and said at least one ground line running from inside said cavity to outside said cavity.

41. The micro-switch of claim 37, wherein said cavity is a hermetic cavity.

42. The micro-switch of claim 37, wherein said at least one conductive contact area is electrically connected with said at least one signal path through at least one conductive structure bonded to said first substrate.

43. The micro-switch of claim 37, wherein said first substrate and said second substrate are bonded by gold thermocompression bonding, said cavity being hermetically sealed with at least one seal ring, and said at least one seal ring comprising at least one layer that contains gold.

44. The micro-switch of claim 43, wherein said gold thermocompression bonding is performed below 400 degrees C. during bonding.

45. The micro-switch of claim 43, wherein said gold thermocompression bonding further comprises heatless bonding of said first substrate and said second substrate.

46. The micro-switch of claim 37, wherein said first substrate and said second substrate are wafers.

* * * * *

UNITED STATES PATENT AND TRADEMARK OFFICE
CERTIFICATE OF CORRECTION

PATENT NO. : 6,872,902 B2
DATED : March 29, 2005
INVENTOR(S) : Michael B. Cohn and Ji-Hai Xu It is certified that error appears in the above-identified patent and that said Letters Patent is hereby corrected as shown below:

Column 15,
Lines 33 and 63, please replace "paths" with -- path --.

Signed and Sealed this

Sixteenth Day of August, 2005

JON W. DUDAS
*Director of the United States Patent and Trademark Office*